(12) United States Patent
Lee et al.

(10) Patent No.: US 9,542,889 B2
(45) Date of Patent: Jan. 10, 2017

(54) DISPLAY DEVICE CONFIGURED TO BE DRIVEN IN ONE OF A PLURALITY OF MODES

(71) Applicant: Samsung Display Co., Ltd., Yongin, Gyeonggi-Do (KR)

(72) Inventors: Cheol-Gon Lee, Seoul (KR); Kyoungju Shin, Hwaseong-si (KR); Chongchul Chai, Seoul (KR); HyunJoon Kim, Yongin-si (KR); Jaekeun Lim, Suwon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 89 days.

(21) Appl. No.: 14/478,530

(22) Filed: Sep. 5, 2014

(65) Prior Publication Data

US 2015/0194121 A1 Jul. 9, 2015

(30) Foreign Application Priority Data

Jan. 8, 2014 (KR) ........................ 10-2014-0002407

(51) Int. Cl.
*G09G 3/36* (2006.01)
*G09G 3/32* (2016.01)
*G11C 19/28* (2006.01)

(52) U.S. Cl.
CPC .......... *G09G 3/3266* (2013.01); *G09G 3/3677* (2013.01); *G11C 19/28* (2013.01); *G09G 2300/043* (2013.01); *G09G 2300/0413* (2013.01); *G09G 2310/0213* (2013.01); *G09G 2310/0251* (2013.01);

(Continued)

(58) Field of Classification Search
CPC ............. G11C 19/00; G09G 3/36; G09G 3/34; G09G 5/00; G09G 5/10; G06F 3/038; G06K 9/00
See application file for complete search history.

(56) References Cited

U.S. PATENT DOCUMENTS 7,417,458 B2  8/2008  Ahn et al.
7,884,795 B2  2/2011  Cho et al.
(Continued)

FOREIGN PATENT DOCUMENTS

KR  10-2010-0132159 A  12/2010
KR  10-2012-0043599 A   5/2012
(Continued)

*Primary Examiner* — Pegeman Karimi
(74) *Attorney, Agent, or Firm* — Knobbe, Martens, Olson & Bear, LLP

(57) ABSTRACT

A display device is disclosed. In one aspect, the display device includes a timing controller configured to receive an image signal and a control signal and output a mode signal and a gate pulse signal based on the image signal and the control signal, wherein the mode signal has a voltage level and wherein the gate pulse signal has a frequency. The display device further includes a clock generator configured to generate a gate clock signal based on the mode signal and the gate pulse signal, wherein the gate clock signal has a voltage level and wherein the clock generator is further configured to set the voltage level of the gate clock signal based at least in part on the mode signal. The display device includes gate lines and a gate driver configured to drive gate lines based at least in part on the gate clock signal.

18 Claims, 11 Drawing Sheets

(52) U.S. Cl.
    CPC ............ *G09G 2310/0289* (2013.01); *G09G 2320/0223* (2013.01); *G09G 2320/103* (2013.01); *G09G 2330/023* (2013.01)

(56) References Cited

U.S. PATENT DOCUMENTS

| | | | |
|---|---|---|---|
| 8,174,478 B2 | 5/2012 | Kim et al. | |
| 2007/0296682 A1* | 12/2007 | Hwang | G09G 3/3677 345/100 |
| 2008/0211760 A1* | 9/2008 | Baek | G09G 3/3677 345/98 |
| 2010/0007653 A1 | 1/2010 | Ahn et al. | |
| 2010/0085348 A1* | 4/2010 | Bae | G09G 3/3648 345/213 |
| 2011/0057914 A1* | 3/2011 | Nam | G09G 3/3648 345/211 |
| 2011/0148853 A1 | 6/2011 | Ko | |
| 2013/0141318 A1 | 6/2013 | Kim et al. | |
| 2014/0210700 A1* | 7/2014 | Won | G09G 3/3677 345/102 |

FOREIGN PATENT DOCUMENTS

| | | |
|---|---|---|
| KR | 10-2012-0063677 A | 6/2012 |
| KR | 10-2012-0111396 A | 10/2012 |
| KR | 10-2013-0071438 A | 6/2013 |

\* cited by examiner

DISPLAY DEVICE CONFIGURED TO BE DRIVEN IN ONE OF A PLURALITY OF MODES

CROSS-REFERENCE TO RELATED APPLICATIONS

A claim for priority under 35 U.S.C. §119 is made to Korean Patent Application No. 10-2014-0002407 filed Jan. 8, 2014, in the Korean Intellectual Property Office, the entire contents of which are hereby incorporated by reference.

BACKGROUND

Field

The described technology generally relates to a display device.

Description of the Related Technology

Display devices, such as liquid crystal displays (LCDs), include a display panel for displaying images and gate and data drivers for driving the display panel. A plurality of gate lines, a plurality of data lines, and a plurality of pixels are formed on the display panel. Each pixel of an LCD includes a switching transistor, a liquid crystal capacitor, and a storage capacitor. The data driver outputs data driving signals to the data lines and the gate driver outputs gate driving signals for driving the gate lines.

After applying a gate-on voltage to the gate electrode of a switching transistor connected to a gate line, the display device provides a data voltage to the source electrode of the switching transistor to display an image.

SUMMARY OF CERTAIN INVENTIVE ASPECTS

One inventive aspect is a display device with low power consumption.

Another aspect is a display device including a display panel including a plurality of pixels connected to a plurality of data lines and a plurality of gate lines, a data driver configured to drive the plurality of data lines, a clock generator configured to generate a gate clock signal in response to a mode signal and a gate pulse signal, a gate driver configured to drive the plurality of gate lines in response to the gate clock signal, and a timing controller, wherein the timing controller controls the data driver and the gate driver in response to an image signal and a control signal provided from an external device and generates the gate pulse signal and the mode signal, wherein the timing controller sets a frequency of the gate pulse signal and a level of the mode signal according to a type of the image signal, and wherein the clock generator sets a voltage level of the gate clock signal in response to the mode signal.

When the mode signal indicates a first mode, the clock generator can generate the gate clock signal in response to the gate pulse signal so as to swing between a gate-on voltage and a second ground voltage, and when the mode signal indicates a second mode, the clock generator generates the gate clock signal in response to the gate pulse signal so as to swing between the gate-on voltage and a first ground voltage, a level of the first ground voltage being different from that of the second ground voltage.

When the image signal is a moving picture, the timing controller can set the mode signal to a first signal level corresponding to the first mode, and when the image signal is a still image, the timing controller sets the mode signal to a second signal level corresponding to the second mode.

When the image signal is a moving picture, the timing controller can generate the gate pulse signal with a first frequency, and when the image signal is a still image, the timing controller generates the gate pulse signal with a second frequency lower than the first frequency.

The display device can further include a voltage generator configured to generate the gate-on voltage, the first ground voltage, and the second ground voltage to be supplied to the clock generator.

The gate driver can include a first gate driver configured to drive first gate lines of the plurality of gate lines and a second gate driver configured to drive second gate lines of the plurality of gate lines.

The timing controller can further generate a start pulse signal. The first gate driver includes a plurality of stages corresponding to the first gate lines and each receiving the gate clock signal, a previous-stage carry signal, a next-stage carry signal, the first ground voltage, and the second ground voltage to provide a carry signal and a gate signal to a corresponding first gate line, and a dummy stage configured to output a dummy carry signal and a dummy gate signal in response to the gate clock signal, a previous-stage carry signal, the start pulse signal, the first ground voltage, and the second ground voltage. A first stage of the plurality of stages receives the start pulse signal as the previous-stage carry signal and the previous-stage carry signal is a carry signal output from a previous stage of the plurality of stages and the next-stage carry signal is a carry signal output from a next stage of the plurality of stages.

The clock generator can set the second ground voltage to be provided to the first gate driver to the first ground voltage in response to the mode signal indicating the second mode.

The clock generator can further generate a reset signal and sets the reset signal to a first level in response to the mode signal indicating the second mode. Each of the plurality of stages of the first gate driver includes a first reset transistor connected between a first output terminal for outputting the carry signal and the first ground voltage and having a gate terminal connected to the reset signal and a second reset transistor connected between a second output terminal for outputting the gate signal and the first ground voltage and having a gate terminal connected to the reset signal.

The clock generator can further generate an inverted gate clock signal opposite to the gate clock signal. The timing controller further generates a start pulse signal. The second gate driver includes a plurality of stages corresponding to the second gate lines and each receiving the gate clock signal, a previous-stage carry signal, a next-stage carry signal, the first ground voltage, and the second ground voltage to provide a carry signal and a gate signal to a corresponding second gate line, and a dummy stage configured to output a dummy carry signal and a dummy gate signal in response to the gate clock signal, a previous-stage carry signal, the start pulse signal, the first ground voltage, and the second ground voltage. A first stage of the plurality of stages receives the start pulse signal as the previous-stage carry signal, and the previous-stage carry signal is a carry signal output from a previous stage of the plurality of stages and the next-stage carry signal is a carry signal output from a next stage of the plurality of stages.

The clock generator can set the second ground voltage to be provided to the second gate driver to the first ground voltage in response to the mode signal indicating the second mode.

The clock generator can further generate a reset signal and sets the reset signal to a first level in response to the mode signal indicating the second mode, and each of the plurality of stages of the second gate driver includes a first reset transistor connected between a first output terminal for outputting the carry signal and the first ground voltage and having a gate terminal connected to the reset signal, and a second reset transistor connected between a second output terminal for outputting the gate signal and the first ground voltage and having a gate terminal connected to the reset signal.

The first gate driver can be arranged adjacent to a first short edge of the display panel and the second gate driver is arranged adjacent to a second short edge of the display panel.

The first gate lines and the second gate lines can be arranged in turns.

The display device can further include a plurality of final-stage reset transistors corresponding to the gate lines, each final-stage reset transistor connected between an end of a corresponding gate line and the first ground voltage and having a gate terminal connected to a next adjacent gate line.

The first ground voltage can be about −5 V and the second ground voltage can be about −10 V.

Another aspect is a plurality of data lines, a data driver configured to drive the data lines, a plurality of gate lines, a display panel including a plurality of pixels connected to the data lines and the gate lines, a timing controller configured to receive an image signal and a control signal and output a mode signal and a gate pulse signal based at least in part on the image signal and the control signal, wherein the mode signal has a voltage level and wherein the gate pulse signal has a frequency, a clock generator configured to generate a gate clock signal based at least in part on the mode signal and the gate pulse signal, wherein the gate clock signal has a voltage level and wherein the clock generator is further configured to set the voltage level of the gate clock signal based at least in part on the mode signal, and a gate driver configured to drive the gate lines based at least in part on the gate clock signal, wherein the timing controller is further configured to set the frequency of the gate pulse signal and the voltage level of the mode signal based at least in part on the image signal.

The voltage level of the mode signal can include first and second voltage levels different from each other, wherein the gate clock signal is configured to swing between a gate-on voltage and a first ground voltage when the mode signal has the second voltage level, and wherein the gate clock signal is configured to swing between the gate-on voltage and a second ground voltage when the mode signal has the first voltage level. The timing controller can be further configured to set the mode signal to the first voltage level when the image signal is a moving image and set the mode signal to the second voltage level when the image signal is a still image. The frequency of the gate pulse signal can include a first frequency and a second frequency less than the first frequency, wherein the gate pulse signal has the first frequency when the mode signal has the first voltage level, and wherein the gate pulse signal has the second frequency when the mode signal has the second voltage level. The display device can further include a voltage generator configured to generate the gate-on voltage, the first ground voltage, and the second ground voltage. The gate lines can be divided into a plurality of first gate lines and a plurality of second gate lines and wherein the gate driver can include a first gate driver configured to drive the first gate lines and a second gate driver configured to drive the second gate lines. The timing controller can be further configured to generate a start pulse signal and wherein the first gate driver can include a plurality of stages respectively corresponding to the first gate lines, wherein each stage is configured to receive the gate clock signal, a previous-stage carry signal, a next-stage carry signal, the first ground voltage, and the second ground voltage and output a carry signal and a gate signal based at least in part on the received signals, wherein the stages can include a dummy stage configured to receive the start pulse signal as the next-stage carry signal and output a dummy carry signal and a dummy gate signal based at least in part on the received signals and a first stage configured to receive the start pulse signal as the previous-stage carry signal, wherein the previous-stage carry signal is the carry signal output from a previous stage and the next-stage carry signal is the carry signal output from a next stage.

The second ground voltage can be substantially equal to the first ground voltage when the mode signal has the second voltage level. The clock generator can be further configured to generate a reset signal and set the reset signal to a first level when the mode signal has the second voltage level and wherein each of the stages of the first gate driver can include a first reset transistor having a gate terminal electrically connected to the reset signal, wherein the first reset transistor is electrically connected between a first output terminal configured to output the carry signal and the first ground voltage and a second reset transistor having a gate terminal electrically connected to the reset signal, wherein the second reset transistor is electrically connected between a second output terminal configured to output the gate signal and the first ground voltage. The clock generator can be further configured to generate an inverted gate clock signal that is inverted with respect to the gate clock signal, wherein the timing controller is further configured to generate a start pulse signal, and wherein the second gate driver includes a plurality of stages respectively corresponding to the second gate lines, wherein each stage is configured to receive the gate clock signal, a previous-stage carry signal, a next-stage carry signal, the first ground voltage, and the second ground voltage and output a carry signal and a gate signal based at least in part on the received signals, and wherein the stages include a dummy stage configured to receive the start pulse signal as the next-stage carry signal and output a dummy carry signal and a dummy gate signal based at least in part on the received signals and a first stage is configured to receive the start pulse signal as the previous-stage carry signal, wherein the previous-stage carry signal is a carry signal output from a previous stage and the next-stage carry signal is a carry signal output from a next stage. The second ground voltage can be substantially equal to the first ground voltage when the mode signal has the second voltage level.

The clock generator can be further configured to generate a reset signal and set the reset signal to a first level when the mode signal has the second voltage level and wherein each of the stages of the second gate driver can include a first reset transistor having a gate terminal electrically connected to the reset signal, wherein the first reset transistor is electrically connected between a first output terminal configured to output the carry signal and the first ground voltage and a second reset transistor having a gate terminal electrically connected to the reset signal, wherein the second reset transistor is electrically connected between a second output terminal configured to output the gate signal and the first ground voltage. The first gate driver can be arranged adjacent to a first short edge of the display panel and the second gate driver can be arranged adjacent to a second short edge of the display panel. The first gate lines and the second gate lines can be alternately arranged. The display device can further include a plurality of final-stage reset transistors respectively corresponding to the gate lines, wherein each final-stage reset transistor has a gate terminal electrically connected to an immediately adjacent gate line, and wherein each final-stage reset transistor is electrically connected between the corresponding gate line and the first ground voltage. The first ground voltage can be about −5 V and the second ground voltage can be about −10 V.

Another aspect is a display device including a plurality of gate lines, a plurality of pixels electrically connected to the gate lines, a timing controller configured to receive an image signal, determine whether the image signal is a moving image or a still image, and output a mode signal based at least in part on the determination, a clock generator configured to generate a gate clock signal based at least in part on the mode signal, wherein the clock generator is further configured to set a frequency and a voltage level the gate clock signal based at least in part on the mode signal, and a gate driver configured to drive the gate lines based at least in part on the gate clock signal.

The voltage level of the mode signal can include first and second voltage levels different from each other, wherein the mode signal has the first voltage level when the image signal is determined to be the moving image, wherein the mode signal has the second voltage level when the image signal is determined to be the still image, and wherein the clock generator is further configured to output a first ground voltage and a second ground voltage, set the second ground voltage to be different from the first ground voltage when the mode signal has the first voltage level, and set the second ground voltage to be substantially the same as the first ground voltage when the mode signal has the second voltage level. The clock generator can be further configured to set the frequency of the clock signal to a first frequency when the mode signal has the first voltage level and set the frequency of the clock signal to a second frequency when the mode signal has the second voltage level, wherein the second frequency is less than the first frequency. The clock signal can be configured to swing between a gate-on voltage and the second ground voltage.

According to at least one embodiment, the power consumption of a display device is reduced by decreasing the frequency of a gate clock signal when a still image is displayed. In particular, although the frequency of the gate clock signal decreases, the reliability of the display device is improved by controlling a gate driver to operate stably.

BRIEF DESCRIPTION OF THE DRAWINGS

FIG. 2 is a diagram schematically illustrating the first gate driver shown in

FIG. 1.

DETAILED DESCRIPTION OF CERTAIN INVENTIVE EMBODIMENTS

Figure 1:
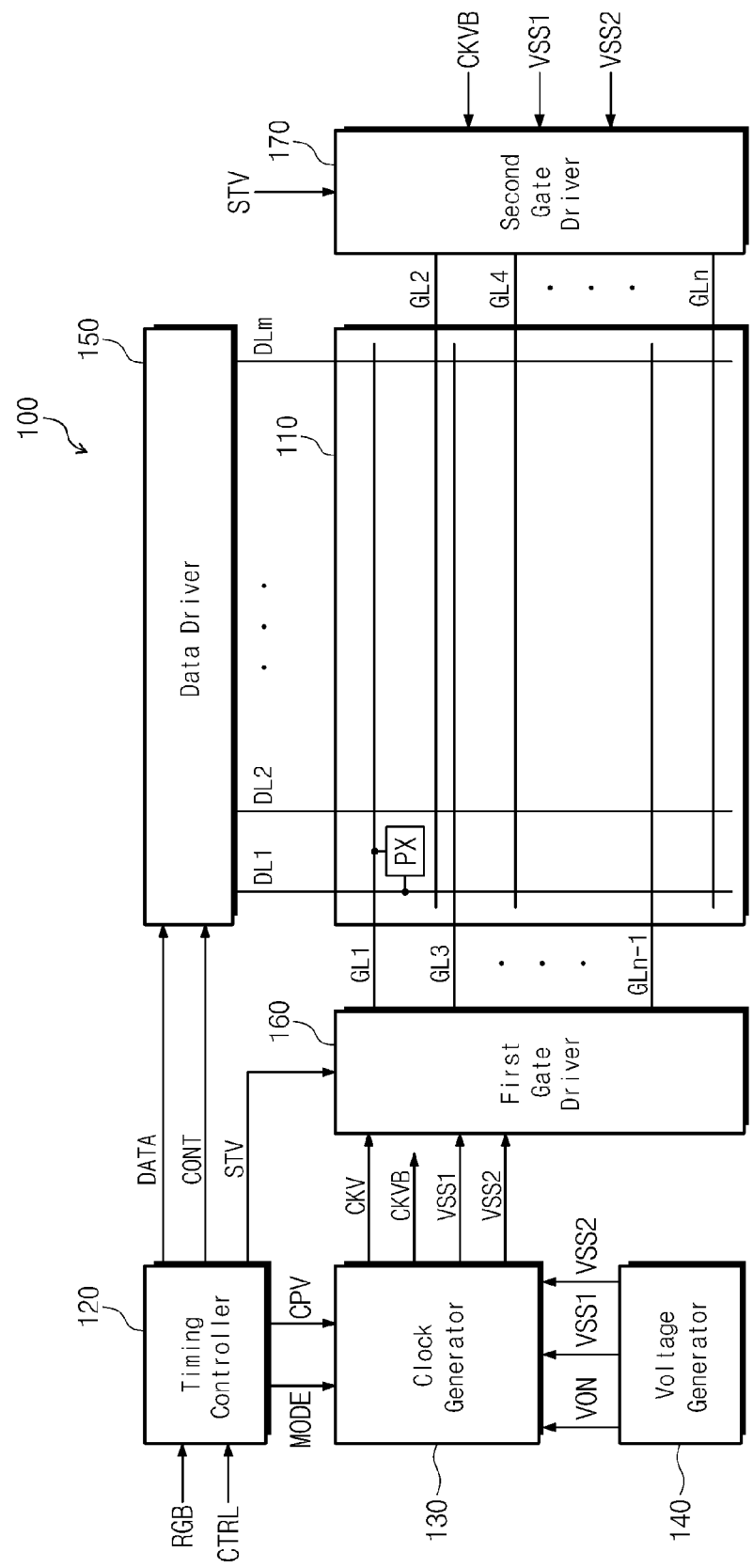
FIG. 1 is a block diagram schematically illustrating a display device according to an embodiment.

As use of handheld electronic devices becomes more widespread, a variety of techniques for reducing power consumption are being researched. The displays of handheld devices, such as tablet PCs, notebook computers, and the like, consume the majority of the power of the device. Thus, the overall power consumption of such handheld devices can be substantially reduced by reducing power consumption of the display.

Embodiments will be described in detail with reference to the accompanying drawings. The described technology, however, may be embodied in various different forms, and should not be construed as being limited only to the illustrated embodiments. Rather, these embodiments are provided as examples so that this disclosure will be thorough and complete, and will fully convey the concept of the described technology to those skilled in the art. Accordingly, known processes, elements, and techniques are not described with respect to some of the embodiments. Unless otherwise noted, like reference numerals denote like elements throughout the attached drawings and written description, and thus descriptions thereof may not be repeated. In the drawings, the sizes and relative sizes of layers and regions may be exaggerated for the sake of clarity.

It will be understood that, although the terms "first", "second", "third", etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the described technology.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein are to be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the described technology. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which the described technology belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein. The term "substantially" as used in this disclosure can include the meaning of completely, almost completely, or to any significant degree in some applications and in accordance with the understanding of those skilled in the art.

FIG. 1 is a block diagram schematically illustrating a display device according to an embodiment.

Referring to FIG. 1, a display device 100 includes a display panel 110, a timing controller 120, a clock generator 130, a voltage generator 140, a data driver 150, a first gate driver 160, and a second gate driver 170.

Depending on the embodiment, the display device 100 can be one of a Liquid Crystal Display (LCD), a Plasma Display Panel (PDP), an Organic Light-Emitting Diode (OLED) display, and a Field Emission Display (FED).

The display panel 110 includes a plurality of data lines DL1 to DLm, a plurality of gate lines GL1 to GLn arranged to cross the data lines DL1 to DLm, and a plurality of pixels PX connected to the data lines DL1 to DLm and the gate lines GL1 to GLn. The data lines DL1 to DLm and the gate lines GL1 to GLn are isolated from one other. In some embodiments, each pixel includes a crystal capacitor, a storage capacitor, and a switching transistor connected to a corresponding data line and a corresponding gate line. The capacitors are connected to the switching transistor.

The timing controller 120 receives an image signal RGB and control signals CTRL, for controlling the display of the image signal RGB, from an external source. For example, the control signal CTRL can include a vertical synchronization signal, a horizontal synchronization signal, a main clock signal, a data enable signal, and the like. The timing controller 120 provides a data signal DATA and a data driving control signal CONT to the data driver 150. The timing controller 120 also provides a start pulse signal STV to each of the first and second gate drivers 160 and 170. Here, the data signal DATA is generated by processing the image signal RGB so as to be suitable for the operating conditions of the display panel 110. The data driving control signal CONT can include a horizontal synchronization signal, a clock signal, and a line latch signal.

The timing controller 120 provides the clock generator 130 with a mode signal MODE and a gate pulse signal CPV. The timing controller 120 may store the image signal RGB in an internal memory (not shown). The timing controller 120 compares a previous image signal PRGB stored in the internal memory with the image signal RGB. If the previous image signal PRGB is different from the image signal RGB within a predetermined time period, the timing controller 120 determines that the image signal RGB as a moving picture. If the previous image signal PRGB is equal to the image signal RGB over the predetermined time period, the timing controller 120 determines the image signal RGB as a still image. When the image signal RGB is determined to be a moving picture, the timing controller 120 operates in a first mode and sets the mode signal MODE to a first signal level or first voltage level (e.g., a high level). When the image signal RGB is determined to be a still image, the timing controller 120 operates in a second mode and sets the mode signal MODE to a second signal level or second voltage level (e.g., a low level).

During the first mode where the image signal RGB is determined to be a moving picture, the timing controller 120 generates the gate pulse signal CPV having a first frequency (e.g., about 60 Hz). During the second mode where the image signal RGB is determined to be a still image, the timing controller 120 generates the gate pulse signal CPV having a second frequency (e.g., about 1 Hz). The timing controller 120 changes the frequency of the data driving control signal CONT, provided to the data driver 150, based on the frequency of the gate pulse signal CPV.

Power consumption of the display device 100 is reduced by lowering the frequency of the gate pulse signal CPV during the second mode when the image signal RGB is determined to be a still image.

The clock generator 130 generates a gate clock signal CKV and an inverted gate clock signal CKVB in response to the mode signal MODE and the gate pulse signal CPV received from the timing controller 120. If the mode signal MODE has the first signal level corresponding to the first mode, the clock generator 130 generates the gate clock signal CKV and inverted gate clock signal CKVB, which swing between a gate-on voltage VON and a second ground voltage VSS2, based on the gate pulse signal CPV. If the mode signal MODE has the second signal level corresponding to the second mode, the clock generator 130 generates the gate clock signal CKV and inverted gate clock signal CKVB, which swing between the gate-on voltage VON and a first ground voltage VSS1, based on the gate pulse signal CPV.

The voltage generator 140 generates the gate-on voltage VON, first ground voltage VSS1, and second ground voltage VSS2, and provides the generated voltages to the clock generator 130. In some embodiments, the gate-on voltage VON is about +15 V, the first ground voltage VSS1 is about −5 V, and the second ground voltage VSS2 is about −10 V.

The clock generator 130 provides each of the first and second gate drivers 160 and 170 with the first and second ground voltages VSS1 and VSS2 in response to the mode signal MODE received from the timing controller 120.

If the mode signal MODE has the first signal level corresponding to the first mode, the clock generator 130 provides the first and second gate drivers 160 and 170 with the first and second ground voltages VSS1 and VSS2 without modifying the voltages.

If the mode signal MODE has the second signal level corresponding to the second mode, the clock generator 130 changes and outputs the second ground voltage VSS2 so as to have substantially the same voltage level as the first ground voltage VSS1. For example, when the mode signal MODE has the second signal level, the clock generator 130 holds both the first and second ground voltages VSS1 and VSS2 at about −5 V.

The data driver 150 outputs gray scale voltages for driving the data lines DL1 to DLm according to the data signal DTAT and the data driving control signal CONT received from the timing controller 120.

The first and second gate drivers 160 and 170 are implemented as ASG (Amorphous silicon gate) drivers wherein amorphous Silicon Thin Film Transistors (a-Si TFTs), oxide semiconductors, crystalline semiconductors, polycrystalline semiconductors, and the like and are formed on the same substrate as the display panel 110. The first gate driver 160 is formed adjacent to a first short edge of the display panel 110, and the second gate driver 170 is formed adjacent to a second short edge of the display panel 110.

The first gate driver 160 drives first gate lines GL1, GL3 . . . GLn-1 of the gate lines GL1 to GLn in response to the start pulse signal STV received from the timing controller 120 and the gate clock signal CKV received from the clock generator 130. In some embodiments, the first gate lines GL1, GL3 . . . GLn-1 are odd-numbered gate lines.

The second gate driver 170 drives second gate lines GL2, GL4 . . . GLn of the gate lines GL1 to GLn in response to the start pulse signal STV received from the timing controller 120 and the inverted gate clock signal CKVB received from the clock generator 130. In some embodiments, the second gate lines GL2, GL4 . . . GLn are even-numbered gate lines of the gate lines GL1 to GLn.

Figure 2:
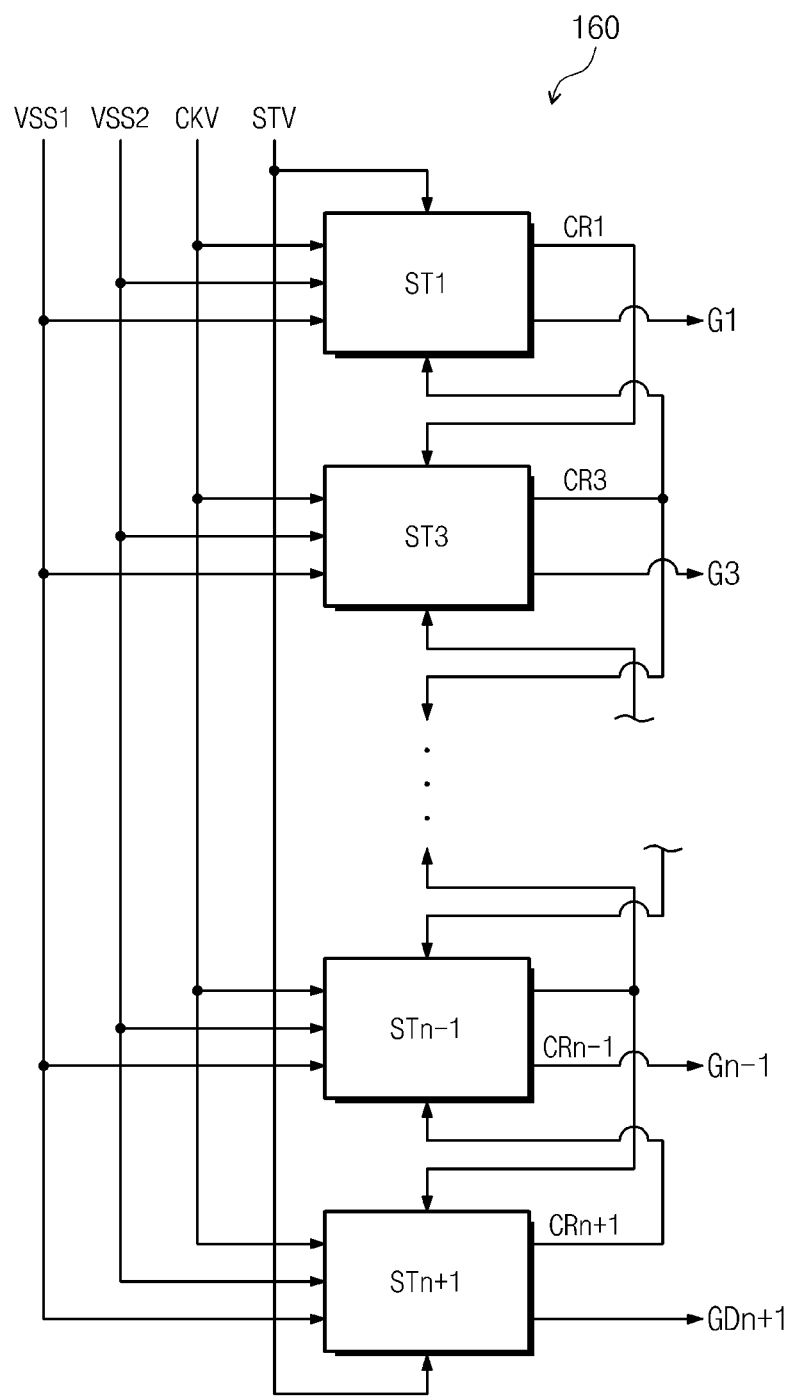

FIG. 2 is a diagram schematically illustrating the first gate driver shown in FIG. 1.

Referring to FIG. 2, the first gate driver 160 includes a plurality of stages ST1 to STn−1 and a dummy stage STn+1. The stages ST1 to STn−1 respectively correspond to first gate lines which are odd-numbered gate lines. A first stage ST1 outputs a carry signal CR1 and a gate signal G1 in response to a start pulse signal STV, a gate clock signal CKV, a first ground voltage VSS1, a second ground voltage VSS2, and a next-stage carry signal CR3.

Each of remaining stages STi (i being 3, 5 . . . (n−1)) other than the first stage ST1 outputs a carry signal CRi and a gate signal Gi in response to a previous-stage carry signal CRi−2, the gate clock signal CKV, the first ground voltage VSS1, the second ground voltage VSS2, and the next-stage carry signal CRi+2.

The dummy stage STn+1 outputs a carry signal CRn+1 and a gate signal GDn+1 in response to a previous-stage carry signal CRn−2, the gate clock signal CKV, the first ground voltage VSS1, the second ground voltage VSS2, and the start pulse signal STV.

Figure 3:
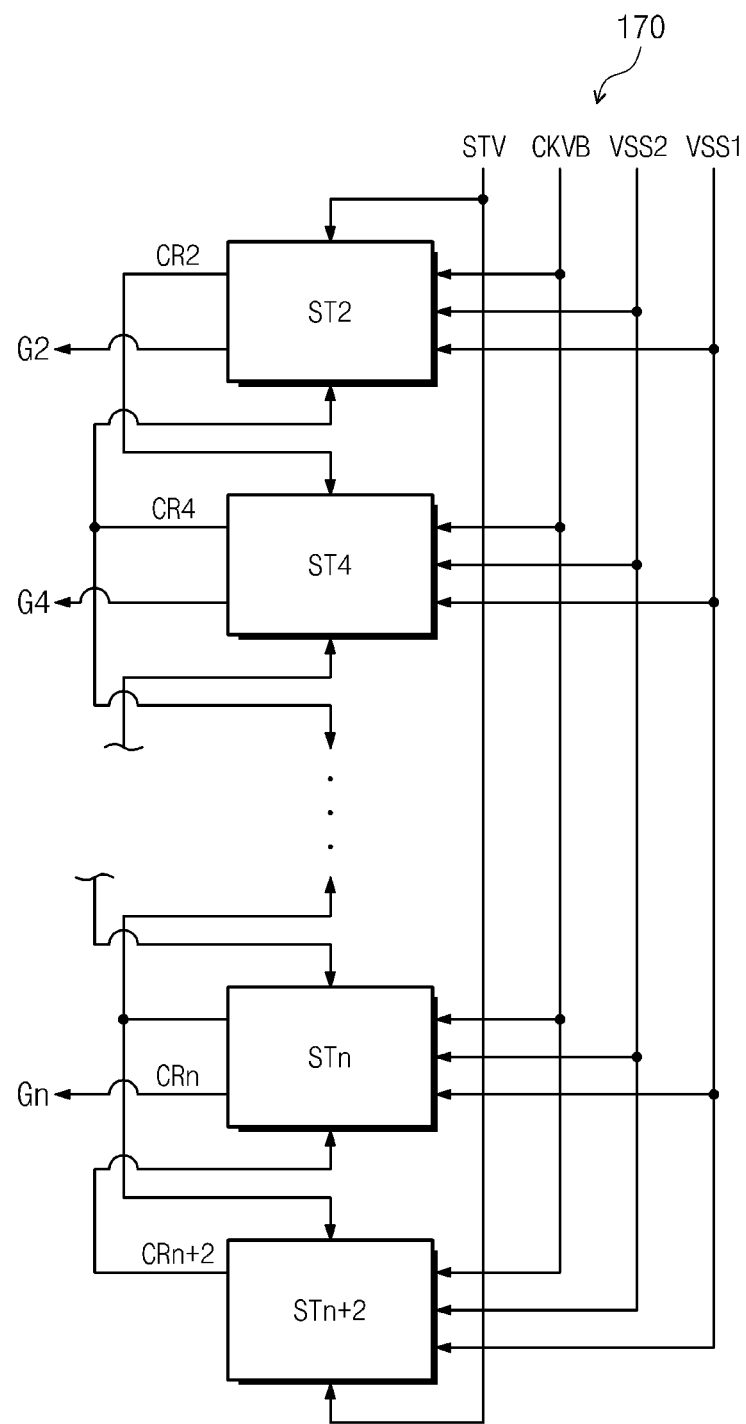
FIG. 3 is a diagram schematically illustrating the second gate driver shown in FIG. 1.

FIG. 3 is a diagram schematically illustrating the second gate driver shown in FIG. 1.

Referring to FIG. 3, the second gate driver 170 includes a plurality of stages ST2 to STn and a dummy stage STn+2. The stages ST2 to STn correspond to second gate lines which are even-numbered gate lines. A first stage ST2 outputs a carry signal CR2 and a gate signal G2 in response to a start pulse signal STV, an inverted gate clock signal CKVB, a first ground voltage VSS1, a second ground voltage VSS2, and a next-stage carry signal CR4.

Each of remaining stages STi (i being 4, 6 . . . n) other than the first stage ST2 outputs a carry signal CRi and a gate signal Gi in response to a previous-stage carry signal CRi−2, the inverted gate clock signal CKVB, the first ground voltage VSS1, the second ground voltage VSS2, and the next-stage carry signal CRi+2.

The dummy stage STn+2 outputs a carry signal CRn+2 in response to a previous-stage carry signal CRn−2, the inverted gate clock signal CKVB, the first ground voltage VSS1, the second ground voltage VSS2, and the start pulse signal STV.

Figure 4:
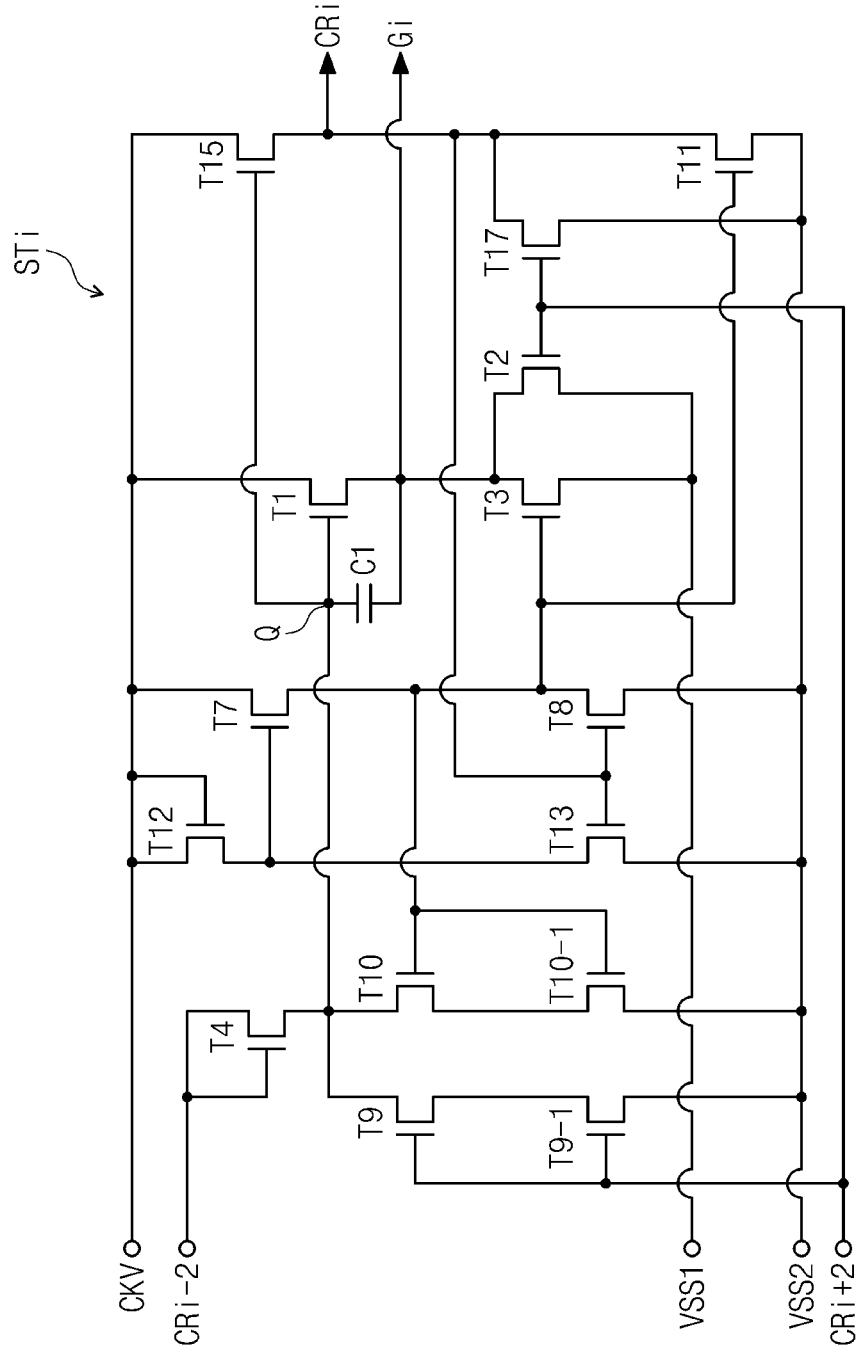
FIG. 4 is a diagram schematically illustrating the stage structure of the first gate driver shown in FIG. 2.

FIG. 4 is a diagram schematically illustrating the stage structure of the first gate driver shown in FIG. 2. In FIG. 4, the illustrated stage structure is that of the first gate driver 160. However, the stages of the second gate driver 170 are configured in substantially the same way as illustrated in FIG. 4 except that a gate clock signal CKV is provided to stages of the first gate driver 160 and an inverted gate clock signal CKVB is supplied to stages of the second gate driver 170.

Referring to FIG. 4, the ith stage STi includes a plurality of transistors T1 to T17 and a capacitor C1. The ith stage STi outputs a carry signal CRi and a gate signal Gi in response to a previous-stage carry signal CRi−2, a gate clock signal CKV, a first ground voltage VSS1, a second ground voltage VSS2, and a next-stage carry signal CRi+2.

When the previous-stage carry signal CRi−2 transitions to a high level, the transistor T4 is turned on and the voltage level of a node Q increases. At this time, if the gate clock signal CKV transitions to a high level, the transistor T1 is turned on, and the gate clock signal CKV is output as the gate signal Gi. Also, since the voltage level of the node Q is boosted by the capacitor C1, the first transistor T1 remains at a turned-on state.

The transistor T15 is turned on according to an increase in the voltage level of the node Q and a low-to-high transition of the gate clock signal CKV. Thus, the carry signal Cri is output with a high level under these conditions.

When the next carry signal CRi+2 output from the next stage STi+2 is at a high level, the transistors T9, T9-1, T2, and T17 are turned on. When the transistors T9 and T9-1 are turned on, the node Q is connected to the second ground voltage VSS2. When the transistor T2 is turned on, an output terminal for outputting the gate signal Gi is connected to the first ground voltage VSS1. When the transistor T17 is turned on, an output terminal for outputting the carry signal CRi is connected to the second ground voltage VSS2.

Figure 5:
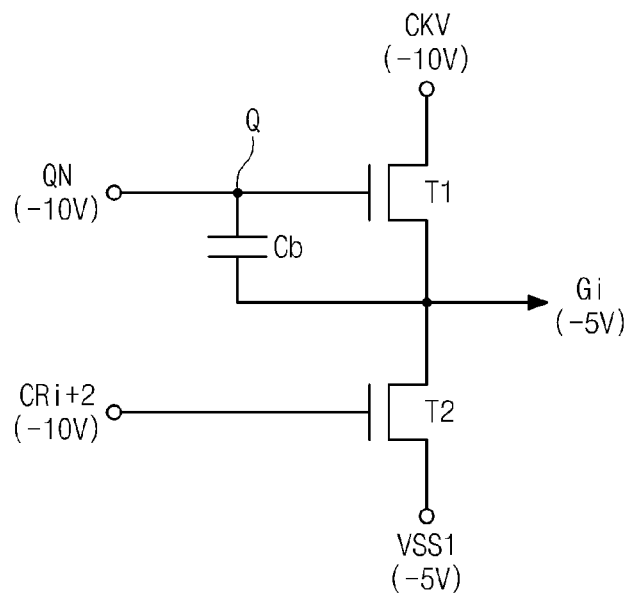
FIG. 5 is a diagram for describing operations of a subset of the transistors of the stage shown in FIG. 4.
Figure 6:
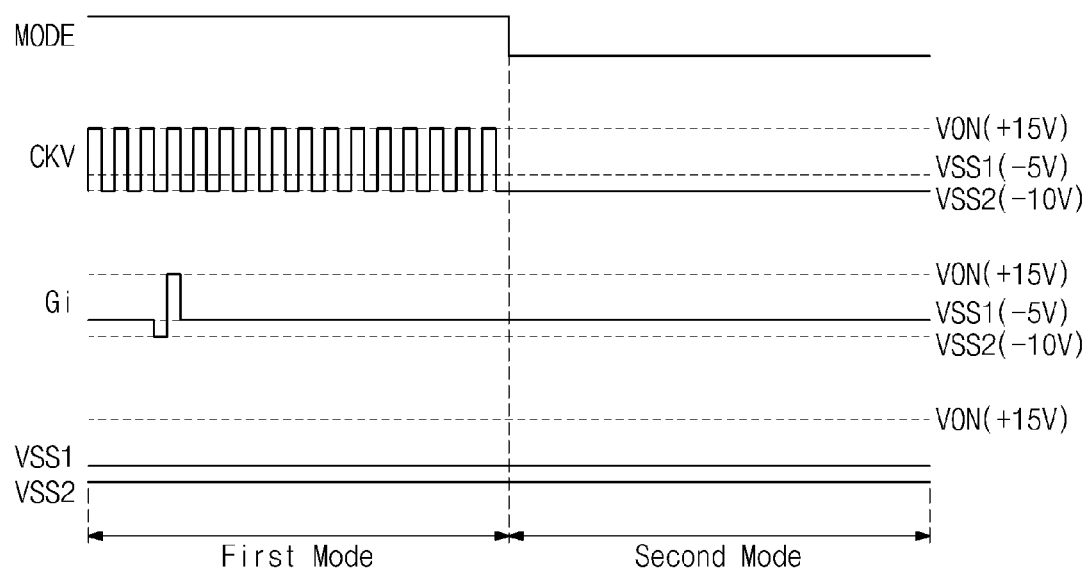
FIG. 6 is a diagram schematically illustrating input and output signals of the stage shown in FIG. 5.

FIG. 5 is a diagram for describing the operations of a subset of the transistors of the stage shown in FIG. 4. FIG. 6 is a diagram schematically illustrating input and output signals of the stage shown in FIG. 5.

Referring to FIGS. 4, 5, and 6, the gate clock signal CKV swings between a gate-on voltage VON and a second ground voltage VSS2 and the first and second ground voltages VSS1 and VSS2 are respectively about −5 V and about −10 V.

As described above, when the image signal RGB is a still image, the timing controller 120 (refer to FIG. 1) outputs the mode signal MODE with a second signal level and outputs a gate pulse signal CPV with a frequency lower than that in a first mode. As the frequency of the gate pulse signal CPV is decreased in the second mode, the frequency of the gate clock signal CKV output from the clock generator 130 (refer to FIG. 1) is also decreased. The length of time over which the gate clock signal CKV is maintained at the second ground voltage VSS2 during the second mode is longer than the corresponding length in the first mode. When the gate line GLi is not driven, the gate clock signal CKV provided to the drain terminal of the transistor T1, a signal QN on the node Q, and the next-stage carry signal CRi+2 have the second ground voltage VSS2, and the gate signal Gi has the first ground voltage VSS1. Although turned off while the gate line GLi is not driven, transistors T1 and T2 suffer from a bias stress due to the difference between the voltage (e.g., −10 V) applied to gate terminals of the transistors T1 and T2 and the voltage (e.g., −5 V) applied to their source terminals. When the second mode is maintained for a relatively long time, the threshold voltages of the transistors T1 and T2 can be changed due to the bias stress or the transistors T1 and T2 can be damaged. This can result in a lower reliability of the display device 100.

Figure 7:
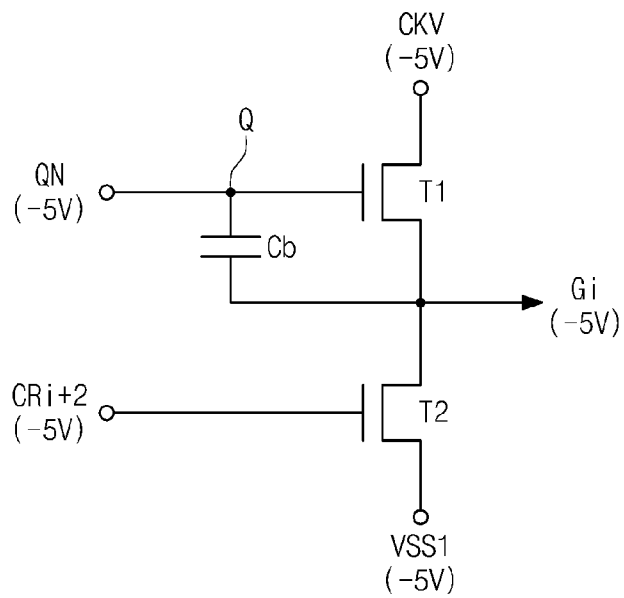
FIG. 7 is a diagram for describing operations of the subset of the transistors of the stage shown in FIG. 4.
Figure 8:
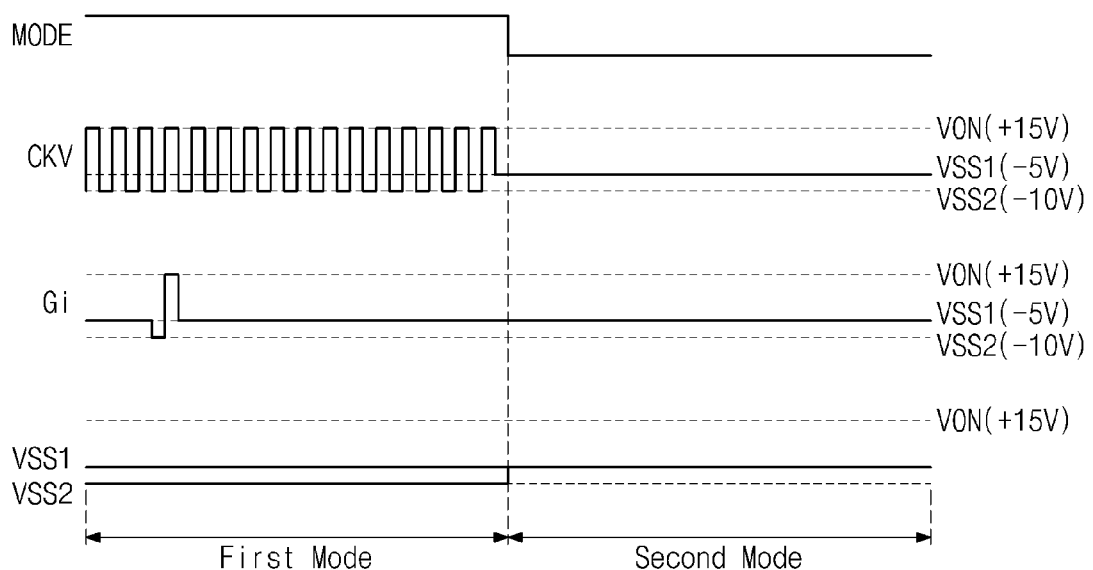
FIG. 8 is a diagram schematically illustrating input and output signals of the stage shown in FIGS. 4 and 7.

FIG. 7 is a diagram for describing operations of the subset of the transistors of the stage shown in FIG. 4. FIG. 8 is a diagram schematically illustrating input and output signals of the stage shown in FIGS. 4 and 7.

Referring to FIGS. 4, 7, and 8, when the image signal RGB is a still image, the timing controller 120 (refer to FIG. 1) outputs the mode signal MODE with the second signal level and outputs the gate pulse signal CPV with a frequency lower than that in a first mode.

The clock generator 130 (refer to FIG. 1) responds to the second signal level of the mode signal MODE and the gate pulse signal CPV to generate the gate clock signal CKV that swings between the gate-on voltage VON and the first ground voltage VSS1. Also, the clock generator 130 outputs the second ground voltage VSS2 of about −5 V that is substantially equal to the first ground voltage VSS1 in the second mode. Thus, the gate clock signal CKV provided to the drain terminal of a transistor T1, the signal QN of the node Q, the next-stage carry signal CRi+2, the carry signal CRi, and the gate signal Gi all have the first ground voltage VSS1.

Transistors T1 and T2 are turned off while the gate line GLi is not driven. If the transistors T1 to T17 of the stage STi are formed of ASG (Amorphous silicon gate) or oxide semiconductor, a leakage current Ids flows when the voltage between the gate and source Vgs=about 0 V. When a relatively low leakage current Ids flows through the transistor T2, the gate line Gi holds the first ground voltage VSS1. Accordingly, influence of the gate line GLi due to noise is minimized.

Figure 9:
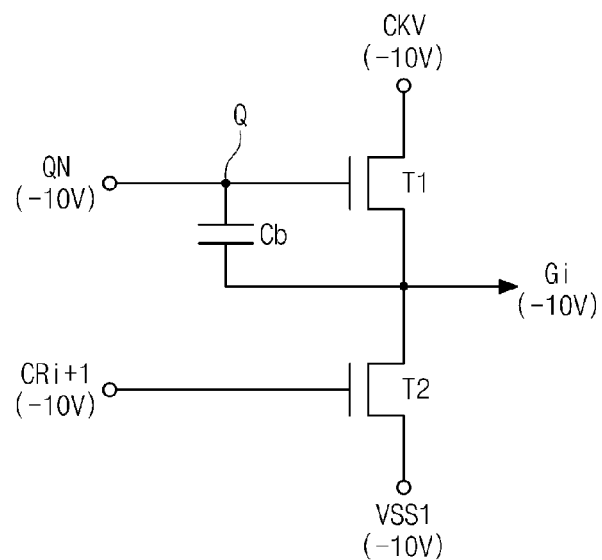
FIG. 9 is a diagram for describing operations of the subset of the transistors of the stage shown in FIG. 4.
Figure 10:
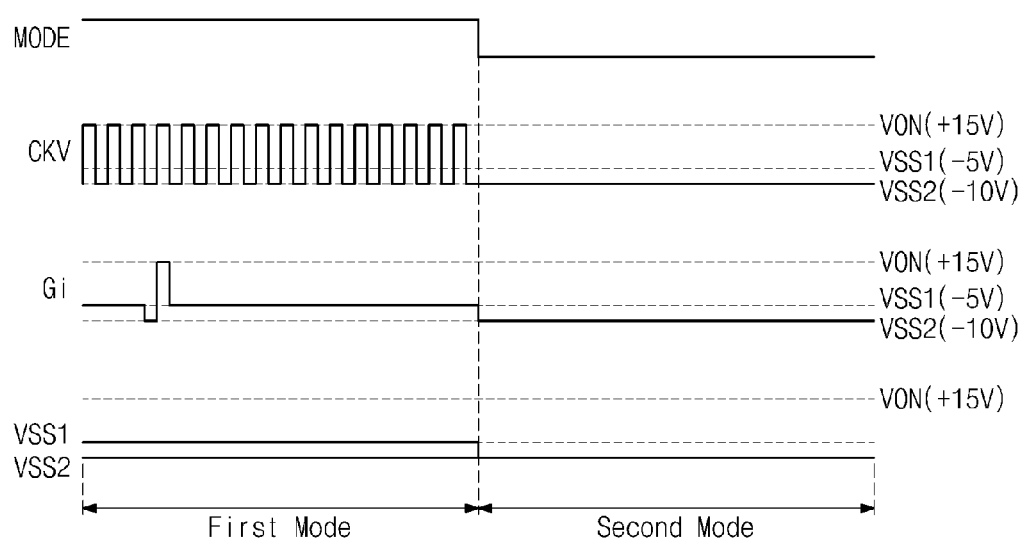
FIG. 10 is a diagram schematically illustrating input and output signals of the stage shown in FIGS. 4 and 9.

FIG. 9 is a diagram for describing the operations of the subset of transistors of the stage shown in FIG. 4. FIG. 10 is a diagram schematically illustrating input and output signals of the stage shown in FIGS. 4 and 9.

Referring to FIGS. 4, 9, and 10, when the image signal RGB is a still image, the timing controller 120 (refer to FIG. 1) outputs the mode signal MODE with the second level and outputs the gate pulse signal CPV with a frequency lower than that in a first mode.

The clock generator 130 (refer to FIG. 1) responds to the second signal level of the mode signal MODE and the gate pulse signal CPV to generate the gate clock signal CKV that swings between the gate-on voltage VON and the second ground voltage VSS2. Also, the clock generator 130 outputs a first ground voltage VSS1 of about −10 V that is substantially equal to the second ground voltage VSS2. Thus, the gate clock signal CKV provided to the drain terminal of the transistor T1, the signal QN of the node Q, the next-stage carry signal CRi+2, the carry signal CRi, and the gate signal Gi all have the second ground voltage VSS2.

Transistors T1 and T2 are turned off while the gate line GLi is not driven. If the transistors T1 to T17 of the stage STi are formed of ASG (Amorphous silicon gate) or oxide semiconductor, a leakage current Ids flows when the voltage between the gate and source Vgs=about 0 V. When a relatively low leakage current Ids flows through the transistor T2, the gate line Gi holds the first ground voltage VSS1. Accordingly, the influence of the gate line GLi due to noise is minimized.

As shown in FIGS. 7 to 10, since the gate clock signal CKV provided to the drain terminal of the transistor T1, the signal QN of the node Q, the next-stage carry signal CRi+2, the carry signal CRi, and the gate signal Gi are all set to one of the first ground voltage VSS1 and the second ground voltage VSS2, it is possible to prevent the transistors T1 to T17 of the stage STi (refer to FIG. 4) from being damaged and to minimize the influence of noise on the signal of the gate line GLi.

Figure 11:
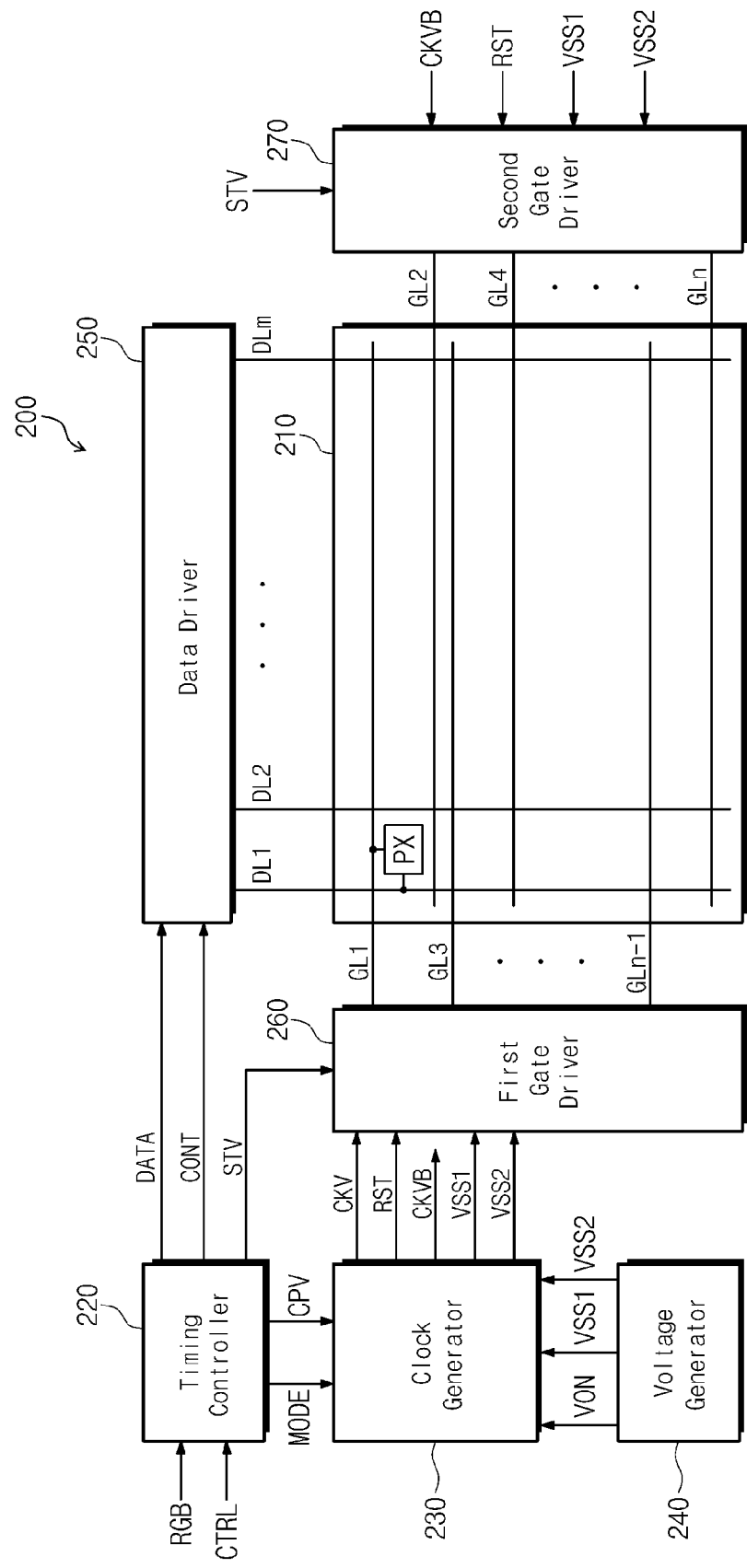
FIG. 11 is a block diagram schematically illustrating a display device according to another embodiment.

FIG. 11 is a block diagram schematically illustrating a display device according to another embodiment.

The display device 200 shown in FIG. 11 is different from the display device 100 shown in FIG. 1 in that a clock generator 230 further generates a reset signal RST. The clock generator 230 generates the reset signal RST as a pulse signal that is periodically activated while the mode signal MODE from a timing controller 220 has a second signal level. The reset signal RST is provided to the first gate driver 260 and the second gate driver 270.

In FIG. 11, the illustrated embodiment shows that the clock generator 230 generates the reset signal RST. However, the described technology is not limited thereto. For example, the timing controller 220 may generate the reset signal RST.

Figure 12:
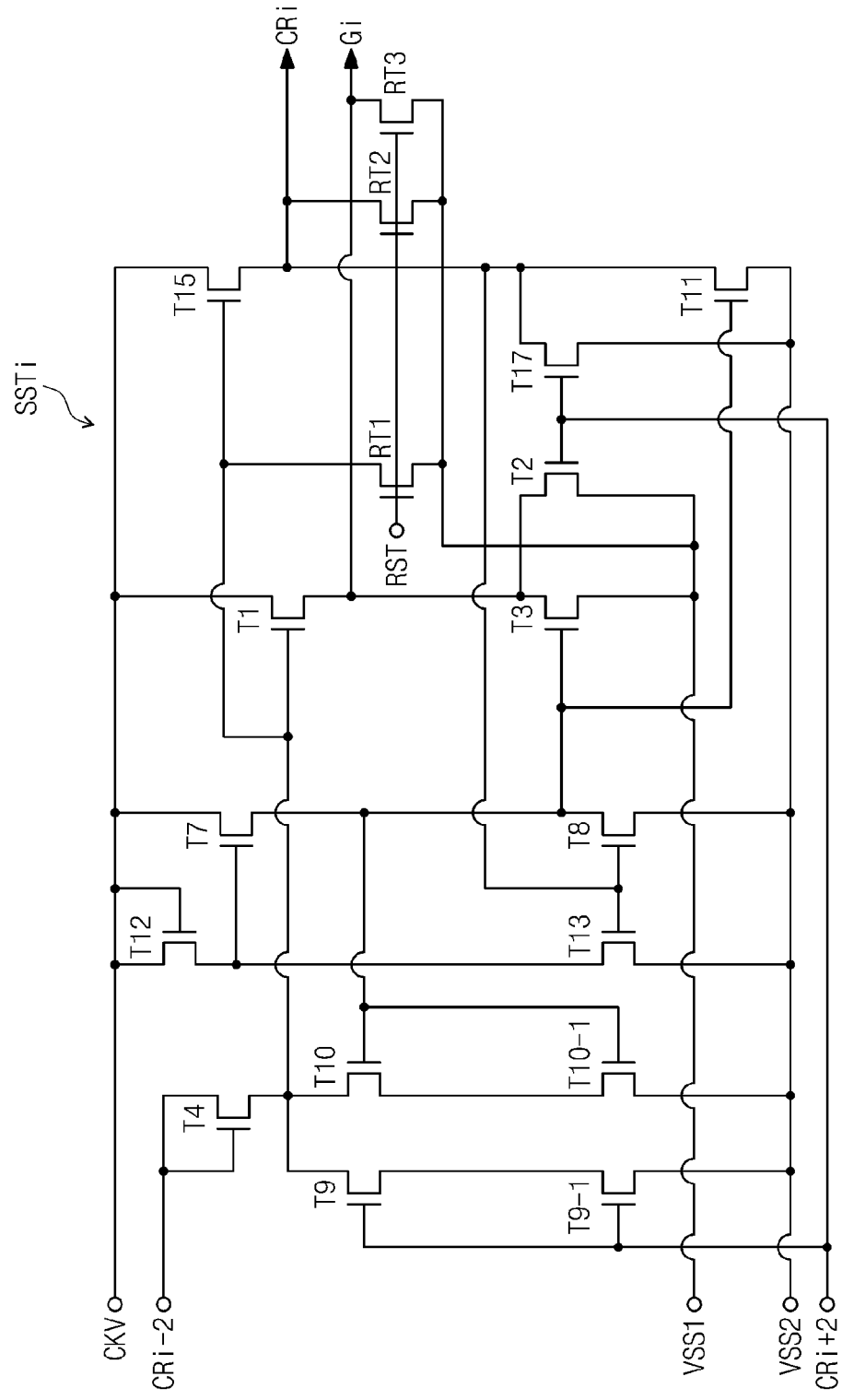
FIG. 12 is a diagram schematically illustrating the stage structure of the first gate driver shown in FIG. 11.
Figure 13:
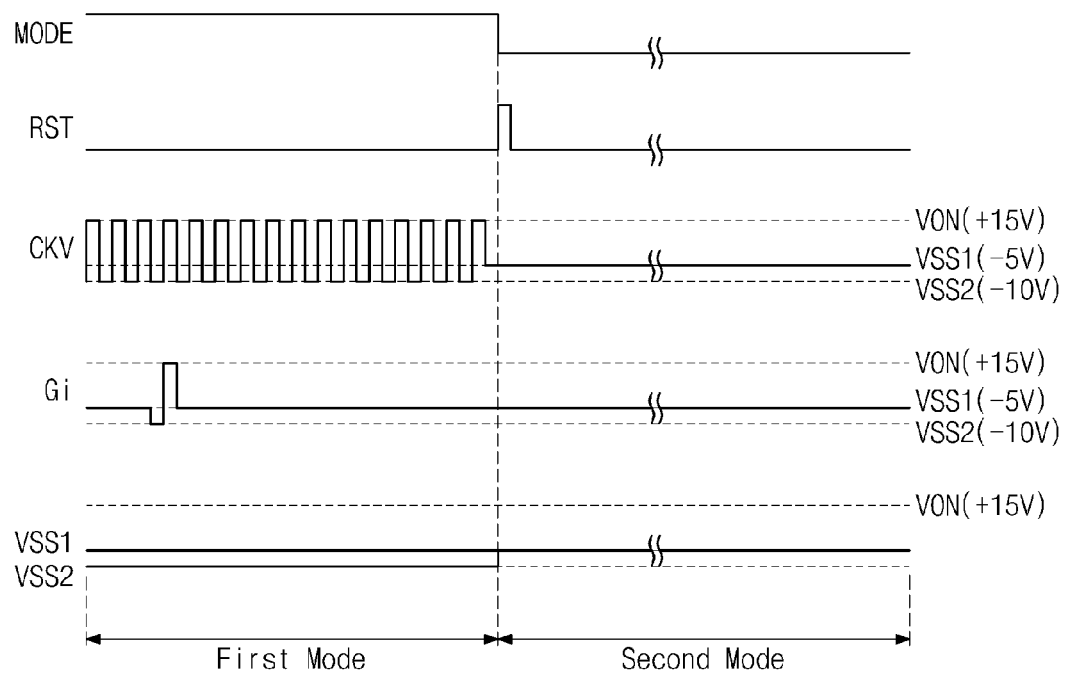
FIG. 13 is a diagram schematically illustrating input and output signals of a stage of the first gate driver shown in FIG. 12.

FIG. 12 is a diagram schematically illustrating the stage structure of the first gate driver shown in FIG. 11. FIG. 13 is a diagram schematically illustrating input and output signals of a stage of the first gate driver shown in FIG. 12.

The stage SSTi shown in FIG. 12 has substantially the same structure as the stage STi shown in FIG. 4, but it further includes reset transistors RT1, RT2, and RT3. In FIG. 12, redundant descriptions about components that are the same as those in the stage STi shown in FIG. 4 are omitted.

Referring to FIGS. 12 and 13, the reset transistor RT1 is connected between the gate terminal of the transistor T15 and the first ground voltage VSS1 and has a gate terminal connected to receive the reset signal RST. The reset transistor RT2 is connected between the output terminal of the carry signal CRi and the first ground voltage VSS1 and has a gate terminal connected to receive the reset signal RST. The reset transistor RT3 is connected between the output terminal of the gate signal Gi and the first ground voltage VSS1 and has a gate terminal connected to receive the reset signal RST.

During the second mode where the mode signal MODE has a second signal level, the reset signal RST is periodically activated. When the reset signal RST is activated to a high level (e.g., a level corresponding to the gate-on voltage VON), the reset transistors RT1 to RT3 are all turned on, and thus, the gate terminal of the transistor T15, the output terminal of the carry signal CRi, and the output terminal of the gate signal Gi are all set to the first ground voltage VSS1. As a time period that the carry signal CRi and the gate signal Gi are held at the first ground voltage VSS1 during the second mode increases, noise causes variations in the carry signal CRi and the gate signal Gi. Abnormal operation of the display device 200 can be prevented by holding the carry signal CRi and the gate signal Gi at the first ground voltage VSS1 and periodically tuning on the reset transistors RT1 to RT3. Thus, reliability of the display device 200 is improved.

Figure 14:
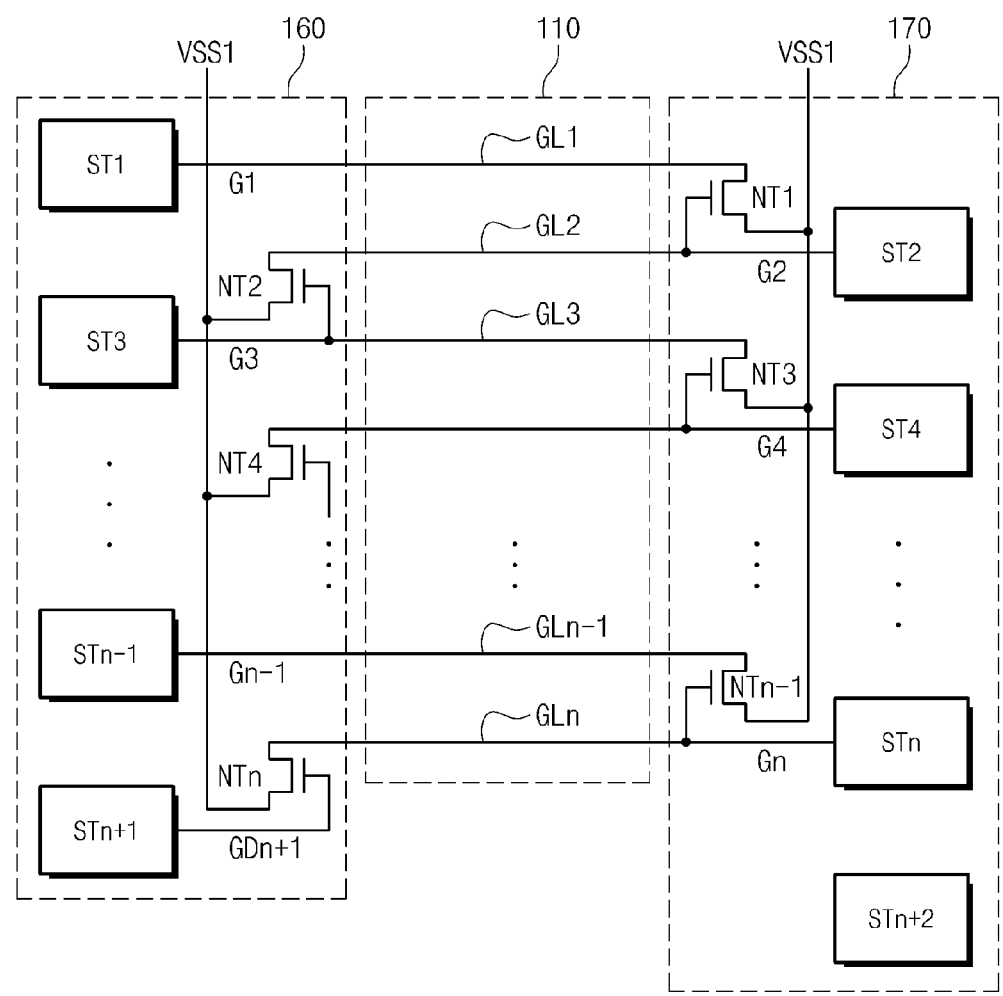
FIG. 14 is a block diagram schematically illustrating a first gate driver and a second gate driver, according to another embodiment.

FIG. 14 is a block diagram schematically illustrating a first gate driver and a second gate driver, according to another embodiment.

Referring to FIG. 14, the first gate driver 160 includes a plurality of stages ST1, ST3 . . . STn-1, a dummy stage STn+1, and final-stage reset transistors NT2, NT4 . . . NTn. The second gate driver 170 includes a plurality of stages ST2, ST4 . . . STn, a dummy stage STn+2, and final-stage reset transistors NT1, NT3 . . . NTn-1.

The stages ST1, ST3 . . . STn-1 and dummy stage STn+1 of the first gate driver 160 are connected in the same manner as described with reference to FIG. 2 and a redundant description thereof is thus omitted. The stages ST2, ST4 . . . STn and dummy stage STn+1 of the second gate driver 170 are connected in the same manner as described with reference to FIG. 3 and a redundant description thereof is thus omitted.

The final-stage reset transistors NT2, NT4 . . . NTn of the first gate driver 160 correspond to second gate lines GL2, GL4 . . . GLn and the final-stage reset transistors NT1, NT3 . . . NTn-1 of the second gate driver 170 correspond to first gate lines GL1, GL3 . . . GLn-1. The final-stage reset transistors NT1, NT3 . . . NTn-1 discharge the voltages of the corresponding gate lines to a first ground voltage VSS1.

For example, the final-stage reset transistor NT1 is connected between the first gate line GL1 and the first ground voltage VSS1 and has a gate terminal connected to the second gate line GL2 immediately adjacent to the first gate line GL1. The final-stage reset transistor NT2 is connected between the second gate line GL2 and the first ground voltage VSS1 and has a gate terminal connected to the third gate line GL3 immediately adjacent to the second gate line GL2.

When next gate lines are driven with a gate-on voltage VON, the final-stage reset transistors NT1 to NTn discharge voltages of the corresponding gate lines to the first ground voltage VSS1. When the gate-on voltages VON of the gate signals G1 to Gn are discharged to the first ground voltage VSS1, the final-stage reset transistors NT1 to NTn improve discharge speed.

While the inventive technology has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A display device, comprising:
   a plurality of data lines;
   a data driver configured to drive the data lines;
   a plurality of gate lines;
   a display panel including a plurality of pixels connected to the data lines and the gate lines;
   a timing controller configured to i) receive an image signal and a control signal and ii) output a mode signal and a gate pulse signal based at least in part on the image signal and the control signal, wherein the mode signal has a voltage level and wherein the gate pulse signal has a frequency;
   a clock generator configured to generate a gate clock signal based at least in part on the mode signal and the gate pulse signal, wherein the gate clock signal has a voltage level and wherein the clock generator is further configured to set the voltage level of the gate clock signal based at least in part on the mode signal; and
   a gate driver configured to drive the gate lines based at least in art on the gate clock signal,
   wherein the timing controller is further configured to set the frequency of the gate pulse signal and the voltage level of the mode signal based at least in part on the image signal, and
   wherein the voltage level of the mode signal comprises first and second voltage levels different from each other, wherein the gate clock signal is configured to swing between a gate-on voltage and a first ground voltage when the mode signal has the second voltage level, and wherein the gate clock signal is configured to swing between the gate-on voltage and a second ground voltage when the mode signal has the first voltage level.

2. The display device of claim 1, wherein the timing controller is further configured to:
   set the mode signal to the first voltage level when the image signal is a moving image; and
   set the mode signal to the second voltage level when the image signal is a still image.

3. The display device of claim 2, wherein the frequency of the gate pulse signal comprises a first frequency and a second frequency less than the first frequency, wherein the gate pulse signal has the first frequency when the mode signal has the first voltage level, and wherein the gate pulse signal has the second frequency when the mode signal has the second voltage level.

4. The display device of claim 1, further comprising a voltage generator configured to generate the gate-on voltage, the first ground voltage, and the second ground voltage.

5. The display device of claim 4, wherein the gate lines are divided into a plurality of first gate lines and a plurality of second gate lines and wherein the gate driver comprises:
   a first gate driver configured to drive the first gate lines; and
   a second gate driver configured to drive the second gate lines.

6. The display device of claim 5, wherein the timing controller is further configured to generate a start pulse signal and wherein the first gate driver comprises a plurality of stages respectively corresponding to the first gate lines, wherein each stage is configured to i) receive the gate clock signal, a previous-stage carry signal, a next-stage carry signal, the first ground voltage, and the second ground voltage and ii) output a carry signal and a gate signal based at least in part on the received signals; wherein the stages include:
   a dummy stage configured to i) receive the start pulse signal as the next-stage carry signal and ii) output a dummy carry signal and a dummy gate signal based at least in part on the received signals; and
   a first stage configured to receive the start pulse signal as the previous-stage carry signal, and
   wherein the previous-stage carry signal is the carry signal output from a previous stage and the next-stage carry signal is the carry signal output from a next stage.

7. The display device of claim 6, wherein the second ground voltage is substantially equal to the first ground voltage when the mode signal has the second voltage level.

8. The display device of claim 6, wherein the clock generator is further configured to generate a reset signal and set the reset signal to a first level when the mode signal has the second voltage level and wherein each of the stages of the first gate driver comprises:

a first reset transistor having a gate terminal electrically connected to the reset signal, wherein the first reset transistor is electrically connected between i) a first output terminal configured to output the carry signal and ii) the first ground voltage; and a second reset transistor having a gate terminal electrically connected to the reset signal, wherein the second reset transistor is electrically connected between i) a second output terminal configured to output the gate signal and ii) the first ground voltage.

9. The display device of claim 5, wherein the clock generator is further configured to generate an inverted gate clock signal that is inverted with respect to the gate clock signal, wherein the timing controller is further configured to generate a start pulse signal, and wherein the second gate driver comprises a plurality of stages respectively corresponding to the second gate lines, wherein each stage is configured to i) receive the gate clock signal, a previous-stage carry signal, a next-stage carry signal, the first ground voltage, and the second ground voltage and ii) output a carry signal and a gate signal based at least in part on the received signals; and wherein the stages include:

a dummy stage configured to i) receive the start pulse signal as the next-stage carry signal and ii) output a dummy carry signal and a dummy gate signal based at least in part on the received signals; and a first stage is configured to receive the start pulse signal as the previous-stage carry signal, wherein the previous-stage carry signal is a carry signal output from a previous stage and the next-stage carry signal is a carry signal output from a next stage.

10. The display device of claim 9, wherein the second ground voltage is substantially equal to the first ground voltage when the mode signal has the second voltage level.

11. The display device of claim 9, wherein the clock generator is further configured to generate a reset signal and set the reset signal to a first level when the mode signal has the second voltage level and wherein each of the stages of the second gate driver comprises:

a first reset transistor having a gate terminal electrically connected to the reset signal, wherein the first reset transistor is electrically connected between i) a first output terminal configured to output the carry signal and ii) the first ground voltage; and a second reset transistor having a gate terminal electrically connected to the reset signal, wherein the second reset transistor is electrically connected between i) a second output terminal configured to output the gate signal and ii) the first ground voltage.

12. The display device of claim 5, wherein the first gate driver is arranged adjacent to a first short edge of the display panel and wherein the second gate driver is arranged adjacent to a second short edge of the display panel.

13. The display device of claim 5, wherein the first gate lines and the second gate lines are alternately arranged.

14. The display device of claim 1, further comprising a plurality of final-stage reset transistors respectively corresponding to the gate lines, wherein each final-stage reset transistor has a gate terminal electrically connected to an immediately adjacent gate line, and wherein each final-stage reset transistor is electrically connected between the corresponding gate line and the first ground voltage.

15. The display device of claim 1, wherein the first ground voltage is about −5 V and the second ground voltage is about −10 V.

16. A display device, comprising:

a plurality of gate lines;

a plurality of pixels electrically connected to the gate lines;

a timing controller configured to i) receive an image signal, ii) determine whether the image signal is a moving image or a still image, and iii) output a mode signal based at least in part on the determination;

a clock generator configured to generate a gate clock signal based at least in part on the mode signal, wherein the clock generator is further configured to set a voltage level of the gate clock signal based at least in part on the mode signal; and a gate driver configured to drive the gate lines based at least in part on the gate clock signal, wherein a voltage level of the mode signal comprises first and second voltage levels different from each other, wherein the gate clock signal is configured to swing between a gate-on voltage and a first ground voltage when the mode signal has the second voltage level, and wherein the gate clock signal is configured to swing between the gate-on voltage and a second ground voltage when the mode signal has the first voltage level.

17. The display device of claim 16, wherein the mode signal has the first voltage level when the image signal is determined to be the moving image, wherein the mode signal has the second voltage level when the image signal is determined to be the still image, and wherein the clock generator is further configured to:

output the first ground voltage and the second ground voltage;

set the second ground voltage to be different from the first ground voltage when the mode signal has the first voltage level; and set the second ground voltage to be substantially the same as the first ground voltage when the mode signal has the second voltage level.

18. The display device of claim 17, wherein the timing controller is further configured to:

set the frequency of the gate clock signal to a first frequency when the mode signal has the first voltage level; and set the frequency of the gate clock signal to a second frequency when the mode signal has the second voltage level, wherein the second frequency is less than the first frequency.

* * * * *